(12) United States Patent
Hubert

(10) Patent No.: US 7,086,868 B2
(45) Date of Patent: Aug. 8, 2006

(54) BOARD-TO-BOARD CONNECTOR

(75) Inventor: John Hubert, Clermont, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

(21) Appl. No.: 11/007,035

(22) Filed: Dec. 8, 2004

(65) Prior Publication Data

US 2005/0124184 A1    Jun. 9, 2005

Related U.S. Application Data

(60) Provisional application No. 60/528,025, filed on Dec. 9, 2003.

(51) Int. Cl.
*H01R 12/00* (2006.01)

(52) U.S. Cl. ...................................................... 439/65

(58) Field of Classification Search ................. 439/65, 439/62, 637, 67, 493, 632, 77, 840
See application file for complete search history.

(56) References Cited

U.S. PATENT DOCUMENTS

| | | | | |
|---|---|---|---|---|
| 3,920,302 A | * | 11/1975 | Cutchaw | ...................... 439/188 |
| 4,724,472 A | * | 2/1988 | Sugimoto et al. | ............ 257/697 |
| 4,894,022 A | * | 1/1990 | Guckenheimer | ............. 439/260 |
| 4,969,824 A | * | 11/1990 | Casciotti | ....................... 439/62 |
| 5,308,249 A | * | 5/1994 | Renn et al. | ..................... 439/62 |
| 5,380,212 A | | 1/1995 | Smeenge, Jr. et al. | ......... 439/86 |
| 5,507,654 A | | 4/1996 | Daly et al. | .................. 439/76.1 |
| 5,599,595 A | | 2/1997 | McGinley et al. | ............. 428/33 |
| 5,675,300 A | | 10/1997 | Romerein | .................... 333/100 |
| 6,483,037 B1 | | 11/2002 | Moore et al. | ................ 174/254 |
| 6,483,713 B1 | | 11/2002 | Samant et al. | .............. 361/749 |
| 6,625,881 B1 | | 9/2003 | Ammar et al. | ................. 29/830 |
| 6,814,620 B1 | | 11/2004 | Wu | ............................ 439/608 |
| 2003/0014728 A1 | | 1/2003 | Shaeffer et al. | ............... 716/15 |
| 2004/0118587 A1 | | 6/2004 | Gilliland | .................... 174/52.4 |

\* cited by examiner

*Primary Examiner*—J. F. Duverne
(74) *Attorney, Agent, or Firm*—Allen, Dyer, Doppelt, Milbrath & Gilchrist, P.A.

(57) ABSTRACT

The disclosed connector and method transfers high frequency signals from one circuit board to another circuit board, while maintaining good electrical and mechanical performance, at a significantly reduced cost. The connector includes a body member and a conductive pin extending through a center portion of the body member to opposing planar surfaces. An arcuate contact member is positioned within the body member and circumferential to at least a portion of the conductive pin. A flexible conductive material is positioned on an opposing surface and engages the arcuate contact member such that the connector can be positioned between cooperating circuit boards, allowing the conductive pin and arcuate contact member to operatively engage the circuit boards for passing signals therebetween.

19 Claims, 2 Drawing Sheets

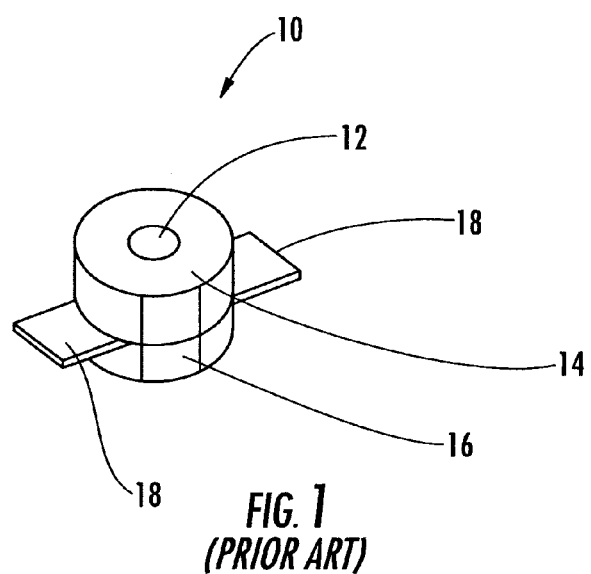
FIG. 1
(PRIOR ART)
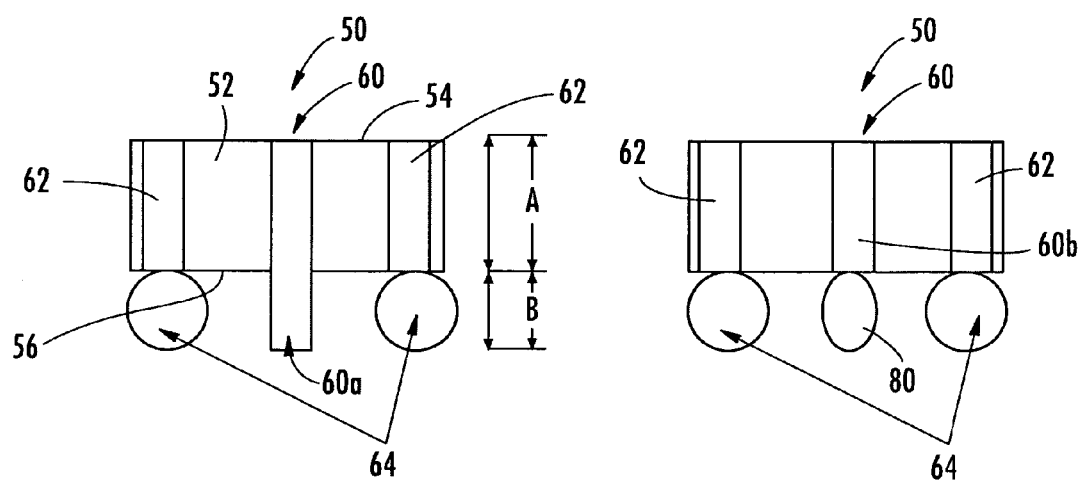
FIG. 2A
FIG. 2B

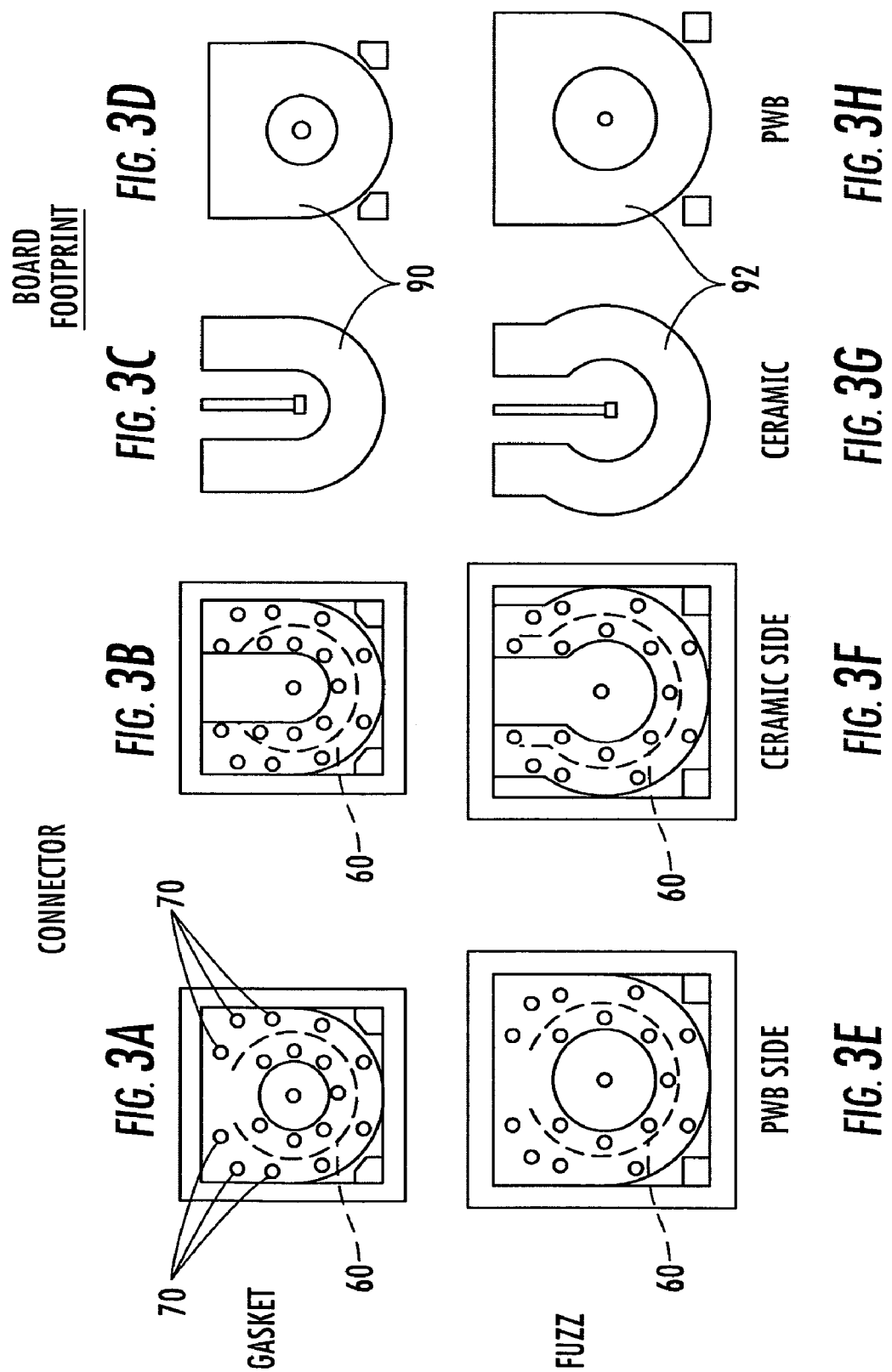

BOARD-TO-BOARD CONNECTOR

RELATED APPLICATION

This application is based upon prior filed copending provisional application Ser. No. 60/528,025 filed Dec. 9, 2003.

FIELD OF THE INVENTION

This invention relates to a connector and method for connecting cooperating circuit boards, and more particularly, this invention relates to a connector and method for connecting a pair of cooperating circuit boards and passing high frequency signals therebetween.

BACKGROUND OF THE INVENTION

Most high frequency radio modules, for example, a high frequency radio transceiver module, use several circuit boards on which electronic components are mounted to reduce module costs or optimize module size. These module costs can be further reduced by mounting only high frequency components on those boards that require more expensive circuit components and materials, for example, by mounting microwave monolithic integrated circuit (MMIC) chips on a ceramic board, and forming a radio frequency (RF) transceiver board. The less expensive low frequency circuit components, for example, power and DC circuit components, can be mounted on less expensive boards, for example, conventional printed wiring boards. Some of these boards can be formed from a copper clad epoxy substrate or glass reinforced resin substrate board, such as FR4 board. The module size can be optimized by either stacking or overlapping the circuit boards. Unfortunately, board-to-board connectors with good performance become more difficult to fabricate and are more expensive as the frequencies being transferred between the different boards increase. At moderate and millimeter wave frequencies, the problem is exacerbated.

Traditionally, moderate frequency board-to-board connections have been accomplished by using miniature, coaxial board-to-board connectors. These coaxial connectors typically are cylindrical, and include a central conductor that could be solid or stranded wire inside a cylindrical, metallic housing, tube or shielded conductor, and separated by a dielectric material in the form of spacers or cylindrical and solid continuous extrusion. An insulating jacket may be included. An outer conductor in this type of connector is typically at ground potential and acts as a return path for current through the central conductor. It also can prevent energy radiation. This outer conductor or shield can also prevent external radiation from affecting the current in the inner or central conductor. An example of such a connector is shown in FIG. 1 and shows a central conductor and external conductor separated by a dielectric. This connector often has to be machined, and the dielectric and central conductor inserted, sometimes complicating the manufacture. As a result, miniature coaxial connectors used for board-to-board connections are relatively expensive and do not have adequate ground connections for high frequency operation and transfer.

Commonly assigned U.S. Pat. No. 6,625,881, issued Sep. 30, 2003, the disclosure which is hereby incorporated by reference in its entirety, discloses a connector system and method for connecting cooperating printed circuit boards and transferring high frequency radio frequency signals between the printed circuit boards. A housing member has a clip receiving slot and circuit board engaging surface that is positioned against a first printed circuit board. At least one electrically conductive clip member has opposing ends and is received within the clip receiving slot. One end is secured to a circuit on the first printed circuit board and the other end is biased in the connection with the circuit of a second printed circuit board. High frequency radio frequency signals are transferred from one printed circuit board to the other printed circuit board via the clip member.

Other techniques used to transfer high frequency signals from one printed wiring board to another board would be advantageous, however, especially between various types of boards, for example, between a printed wiring board (PWB) having lower frequency and/or less expensive components, for example, DC signal and power components, and a ceramic board that mounts high frequency and/or more expensive components, for example, microwave monolithic integrated circuit (MMIC) chips.

SUMMARY OF THE INVENTION

The present invention provides a unique connector and method of interconnecting cooperating circuit boards, allowing the transfer of high frequency signals from one circuit board to the other circuit board, while maintaining good electrical and mechanical performance, at a significantly reduced cost. High frequency signals can now be transferred with low insertion loss and low return loss using the affordable connector of the present invention. Low cost materials are used for a body, a central conductor, and a ground connection. Standard surface-mount attachment techniques for printed wiring boards can also be used. Board-to-board vertical alignment tolerances can be compensated, and the frequency performance of board-to-board connections can be extended. The connector can be scaled to match mating boards of different dielectric constants or heights.

The present invention includes a connector adapted for connecting cooperating circuit boards. A body member has opposing surfaces, and a conductive pin extends through a center portion of the body member to opposing planar surfaces. An arcuate contact member is circumferential to at least a portion of the conductive pin and extends through the body member to opposing planar surfaces. A flexible conductive material is positioned on an opposing surface and engages the arcuate contact member. This connector is positioned between cooperating circuit boards and the conductive pin and arcuate contact member engage circuit boards for passing signals therebetween.

In one aspect of the present invention, the flexible conductive material is formed as a compliant extruded gasket, which can be made of silicon with plated copper filler. The conductive pin is formed for passing radio frequency signals between the circuit boards, while the arcuate contact members is formed for passing ground signals. Isolation vias can be formed within the body member for isolating the conductive pin and arcuate contact member.

In another aspect of the present invention, the conductive pin is formed as a compliant biasing element, for example, a fuzz button. The body member can be formed as a glass fiber reinforced material such as FR4 board. The opposing face opposite the flexible conductive material can be adapted to be soldered to a circuit board, while another circuit board can be pressed against the opposing face, squeezing and compressing the flexible conductive material for an adequate connection to any circuit traces or electrical conductors on the circuit board. The fuzz button is also compressed to create an adequate connection as it extends beyond the face.

In yet another aspect of the present invention, a flexible conductive material can engage the conductive pin on the same surface as the flexible conductive material engaging the arcuate contact member. This additional flexible conductive material can be adapted for passing signals from the conductive pin through the flexible conductive material into the circuit board. In this manner, a compliant biasing element, for example, the fuzz button, does not have to be used.

A method aspect of the present invention is also disclosed.

BRIEF DESCRIPTION OF THE DRAWINGS

Other objects, features and advantages of the present invention will become apparent from the detailed description of the invention, which follows when considered in light of the accompanying drawings in which:

FIG. 1 is a perspective view of a coaxial board-to-board connector of the prior art.

FIG. 2A is a fragmentary, sectional view of the board-to-board connector of the present invention and showing a fuzz button as the center conductive pin.

FIG. 2B is a second embodiment of the present invention similar to FIG. 2A, but showing a central conductive pin and flexible conductive material engaging the central conductive pin.

FIGS. 3A and 3B show the respective opposing sides of the connector shown in FIG. 2B, which engage respective PWB and ceramic boards.

FIGS. 3C and 3D show the metallization footprint on the respective ceramic and PWB boards.

FIGS. 3E–3H are similar drawing figures to FIGS. 3A–3D, but showing the opposing sides on the connector and the respective ceramic and PWB metallization footprint on the respective boards.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention provides a novel and unobvious connector and method of connecting cooperating circuit boards and transferring high frequency signals from one circuit board to another circuit board, while maintaining good electrical and mechanical performance, at a significantly reduced cost. Using the connector of the present invention, high frequency signals can be transferred with low insertion loss and low return loss. Lower cost materials are used for a body member, center conductor, and a ground connection. Standard surface-mount attachment techniques for printed wiring boards can also be used, and board-to-board vertical alignment tolerances can be compensated. The frequency performance of these board-to-board connectors can be extended and this connector can be scaled to match mating boards of different dielectric constants or heights.

FIG. 1 shows a typical board-to-board coaxial connector 10 of the prior art. This connector 10 can be surface mounted for connecting cooperating printed wiring boards, i.e., printed circuit or similar boards. This miniature, coaxial board-to-board connector includes a central conductor 12 that could be formed from a solid material or stranded wire. It is positioned inside a cylindrical dielectric 14 that is contained within a cylindrical shield conductor or housing 16. Metallic flanges 18 can be incorporated on the housing for supporting the coaxial connector 10 on a board and allowing a board-to-board connection. The outer conductor or housing 16 can form a shield and prevent external radiation from affecting current flow in other conductors or within the inner central conductor. One drawback of this type of coaxial board-to-board connector 10, however, is that it does not have adequate ground connections for higher frequency operation and the connector 10 cannot be easily scaled for circuit boards having different dielectric constants or heights.

FIGS. 2A and 2B are fragmentary, partial sectional views of two different embodiments of the novel and unobvious surface mounted board-to-board connector of the present invention. To simplify the explanation, similar elements between the two connector embodiments are given the same reference numeral, and different or changed elements between the two different connector embodiments are given different reference numerals.

FIGS. 2A and 2B and FIGS. 3A, 3B, 3E and 3F show two embodiments of the surface mount board-to-board connector 50 of the present invention. As shown in FIGS. 2A and 2B, the connector 50 is formed from a body member 52 having opposing planar surfaces 54,56, which could be termed upper and lower surfaces for non-limiting description purposes only. A conductive pin 60 extends through a center portion of the body member 52 to the opposing planar surfaces 54,56, and in the embodiment shown in FIG. 2A, has one end extending through the lower, opposing surface 56 and extending outward therefrom. An arcuate contact member 62 is formed within the body member 52 and formed circumferential to at least a portion of the conductive pin 60 and extends through the body member to the opposing planar surfaces. The circumferential configuration is shown by the dashed lines in FIGS. 3A, 3B, 3E and 3F. A flexible conductive material 64 that can be shaped in an arcuate configuration similar to the arcuate contact member 62 is positioned on the lower, opposing face 56 and engages the arcuate contact member 62. The connector 50 can be positioned between cooperating circuit boards such that the conductive pin 60 and arcuate contact member 62 engage traces or circuit paths formed on the circuit boards and pass signals therebetween. In the present invention, the conductive pin 60 is formed for passing radio frequency signals and preferably high frequency RF signals between cooperating circuit boards, while the arcuate contact member 62 is formed for passing ground signals.

The flexible conductive material 64 can be formed as a compliant extruded gasket or equivalent structure, and can be formed from a polymer having a metal filler, such as silicon with silver plated copper filler in one non-limiting example. The body member 52 can be formed from glass fiber reinforced material, such as a copper clad epoxy substrate, for example, FR4 material. Typically the body member 52 can be about 50 mils thick, as represented by the dimension "A" in FIG. 2A, as a non-limiting example. The flexible conductive material forming the gasket can be about 36 mils thick, as represented by the dimension "B" in FIG.

2A, and can be compressed to about 10 mils thick when the connector 50 is mated with cooperating circuit boards, as non-limiting examples.

As shown in FIGS. 3A, 3B, 3E and 3F, isolation vias 70 can be formed within the body member for isolating the conductive pin 60 and arcuate contact member 52. The conductive vias 70 can extend through the body member 52 to opposing surfaces 54,56 and can be plated through-holes in certain non-limiting aspects of the invention. FIGS. 2A and 2B do not show in detail any via construction in order to simplify the explanation of the present invention.

The embodiment of FIG. 2A has a conductive pin 60 formed as a compliant biasing element such as a fuzz button. The fuzz button has an extension 60a that extends away from the lower, opposing face 56 and acts as an electrical contact for circuit traces or other electrical paths formed on a circuit board. When the two circuit boards cooperate with each other and the connector 50 is positioned therebetween, the fuzz button can compress similar to the flexible conductive material 64, and form an adequate connection to a circuit board.

FIG. 2B shows another embodiment of the present invention in which a fuzz button is not used, but instead, the conductive pin 60 could be a solid or similar conductive material 60b and extend through the body member and terminate at each opposing side 54,56. A flexible conductive material 80 formed of material similar to the flexible conductive material 64 under the arcuate conductive member 62 and positioned under the conductive pin 60 to make contact to a circuit board. Typically, each flexible conductive material 64, 80 can be adhesive in nature and is adhered to the body member at the appropriate positions.

The upper, opposing surface 54 having the exposed conductive pin 60 and arcuate contact member 62 could be soldered to a circuit board. FIGS. 3C, 3D, 3G and 3H show the respective metallization footprints for a ceramic board, to which the ceramic or lower, opposing side 56 of the connector 50 would engage, and a PWB board, to which a PWB or upper, opposing side 54 of a connector 50 would engage. The metallizations 90 for the FIG. 2B connector embodiment on respective ceramic and PWB boards is shown in FIGS. 3C and 3D and metallizations 92 for the fuzz button embodiment is shown in FIGS. 3G and 3H. It should be understood that the metallizations 92 adapted for connecting to a fuzz button embodiment shown in FIG. 2A has a larger central diameter than the central diameter for the embodiment using the gasket and conductive pin shown in FIG. 2B. The conductive pin 60 using the fuzz button requires a larger contact point in order to maintain proper coaxial properties and adjust the dielectric to the proper amount for proper conductive impedance and associated factors.

The body member 52 is typically similar in size to a small "button" and can be referred to as a "connector button." For example, the gasket embodiment connector shown in FIGS. 2B, 3A and 3B could be about 0.225 inches square and the fuzz button embodiment connector shown in FIGS. 2A, 3E and 3F could be about 0.3 inches square, as non-limiting examples.

The connectors 50 initially can be formed on a large sheet, for example, FR4 sheet. After processing and insertion of appropriate conductive pins and arcuate contact members, individual connectors can be cut from the sheet. The connectors can be scaled for boards with different dielectric constants or heights.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed:

1. A connector for connecting cooperating circuit boards, which comprises:
    a body member having opposing surfaces;
    a conductive pin extending through a center portion of the body member to opposing planar surfaces;
    an arcuate contact member circumferential to at least a portion of the conductive pin and extending through the body member to opposing planar surfaces; isolation vias formed within the body member for isolating the conductive pin and the arcuate contact member; and
    a flexible conductive material positioned on an opposing surface and engaging the arcuate contact member, wherein the body member is adapted to be positioned between cooperating circuit boards with the conductive pin and arcuate contact member operatively engaging circuit boards for passing signals therebetween.

2. A connector according to claim 1, wherein the flexible conductive material comprises a polymer having a metal filler.

3. A connector according to claim 2, wherein the polymer comprises silicon and copper filler.

4. A connector according to claim 1, wherein the conductive pin is formed for passing radio frequency signals and the arcuate contact member is formed for passing ground signals.

5. A connector according to claim 1, wherein the conductive pin comprises a compliant biasing element.

6. A connector according to claim 5, wherein the compliant biasing element comprises a fuzz button.

7. A connector according to claim 1, wherein the body member comprises glass fiber reinforced material.

8. A connector according to claim 1, wherein the opposing face of the body member opposite the flexible conductive material is adapted to be soldered to a circuit board.

9. A connector according to claim 1, and further comprising a flexible conductive material engaging the conductive pin on the same surface as the flexible conductive material engaging the arcuate contact member, and adapted for passing signals from the conductive pin and through the flexible conductive material.

10. A method for connecting a pair of cooperating circuit boards, which comprises: providing a connector formed from a body member having opposing surfaces, a conductive pin extending through a center portion of the body member to opposing planar surfaces, and an arcuate contact member circumferential to at least a portion of the conductive pin and extending through the body member to opposing planar surfaces, and a flexible conductive material positioned on an opposing surface and engaging the arcuate contact member; and
    positioning the body member between two circuit boards to be connected such that the conductive pin and arcuate contact member operatively engage circuit boards and pass signals therebetween through the conductive pin and arcuate contact member and flexible conductive material by passing ground signals through the arcuate contact member and flexible conductive material between cooperating circuit boards and passing radio frequency signals through the conductive pin between cooperating circuit boards.

11. A method according to claim 10, which comprises forming the flexible conductive material from a polymer having a metal filler.

12. A method according to claim 11, wherein the polymer comprises silicon and copper filler.

13. A method according to claim 10, which comprises forming the body member from glass fiber reinforced resin material.

14. A method according to claim 10, which comprises forming the conductive pin as a compliant biasing element.

15. A method according to claim 14, which comprises forming the compliant biasing element as a fuzz button.

16. A method according to claim 10, which comprises positioning a flexible conductive material between the conductive pin and circuit board on the opposing surface having the flexible conductive material engaging the arcuate contact member.

17. A method according to claim 10, which comprises soldering the body member opposite the flexible conductive material onto a circuit board.

18. A method according to claim 10, which comprises forming isolation vias through the body member for to isolate the conductive pin and the arcuate contact member.

19. A method for connecting a pair of cooperating circuit boards, which comprises:

providing a connector formed from a body member having opposing surfaces, a conductive pin extending through a center portion of the body member to opposing planar surfaces, and an arcuate contact member circumferential to at least a portion of the conductive pin and extending through the body member to opposing planar surfaces, and a flexible conductive material positioned on an opposing surface and engaging the arcuate contact member;

forming isolation vias through the body member to isolate the conductive pin and arcuate contact member; and positioning the body member between two circuit boards to be connected such that the conductive pin and arcuate contact member operatively engage circuit boards and pass signals therebetween through the conductive pin and arcuate contact member and flexible conductive material.

* * * * *